United States Patent [19]

Cheung

[11] Patent Number: 4,740,386
[45] Date of Patent: Apr. 26, 1988

[54] METHOD FOR DEPOSITING A TERNARY COMPOUND HAVING A COMPOSITIONAL PROFILE

[75] Inventor: Jeffrey T. Cheung, Thousand Oaks, Calif.

[73] Assignee: Rockwell International Corporation, El Segundo, Calif.

[21] Appl. No.: 31,733

[22] Filed: Mar. 30, 1987

[51] Int. Cl.$^4$ .......................... B05D 3/06; B05D 5/12; H01L 31/00

[52] U.S. Cl. .................................... 427/53.1; 427/76; 437/234; 136/261

[58] Field of Search .......................... 427/76, 53.1, 42; 136/261; 148/DIG. 93, DIG. 94; 437/234

[56] References Cited

U.S. PATENT DOCUMENTS

| | | | |
|---|---|---|---|
| 3,850,685 | 11/1974 | Sakai | 437/234 |
| 3,920,860 | 11/1975 | Freller et al. | 437/234 |
| 4,281,030 | 7/1981 | Silfvast | 427/42 |
| 4,418,096 | 11/1983 | Gauthier et al. | 427/76 |
| 4,435,224 | 3/1984 | Durand | 427/76 |
| 4,447,470 | 5/1984 | Kay | 427/76 |
| 4,523,051 | 6/1985 | Michelsen et al. | 427/76 |
| 4,534,840 | 8/1985 | Shindo et al. | 437/234 |
| 4,655,848 | 4/1987 | Kay et al. | 427/76 |

OTHER PUBLICATIONS

Bartoli et al., "Thermal Modelling of Laser Damage in 8–14 $\mu$m Hg CdTe... Detectors" *Journal. Appl. Physics,* vol. 46, #10, (Oct. 1975), pp. 4519–4525.

Harrison et al., "Ohmic Contacts Produced by Laser Beams to Indium Implanted into & Indium Deposited onto GaAs"; Laser & Electron Beam Proceeding of Materials.

Laude et al., "Laser-Induced Synthesis of Thin CuInSe$_2$ Films"; *Solar Cells,* 16, (Jan./Feb. 1986), pp. 199–209.

Hanus et al., "Preparation of CdTe Thin Films by Laser Irradiation of Electrodeposits" *Thin Solid Films,* 137, (Mar., 1986), pp. 231–234.

*Primary Examiner*—John H. Newsome
*Assistant Examiner*—Marianne L. Padgett
*Attorney, Agent, or Firm*—H. Fredrick Hamann; Craig O. Malin

[57] ABSTRACT

Thermal sources of Te and of Hg are provided in a vacuum chamber to furnish constant effusion of Te and Hg. Laser radiation is used to evaporate a beam of CdTe from a target of CdTe in the chamber. The laser radiation is modulated to vary the beam intensity of CdTe and thereby deposit a controlled compositional profile of $Hg_{(1-x)}Cd_xTe$ on a substrate located in the chamber.

9 Claims, 6 Drawing Sheets

METHOD FOR DEPOSITING A TERNARY COMPOUND HAVING A COMPOSITIONAL PROFILE

STATEMENT OF GOVERNMENT INTEREST

The Government has rights in this invention pursuant to Contract No. F33615-85-C-1841 awarded by the Air Force.

BACKGROUND OF THE INVENTION

This invention relates to the field of forming thin film electronic devices, and particularly to forming ternary semiconductor films having predetermined compositional gradients.

The technique of thin film deposition is an important process in the manufacture of solid state electronic devices. Many thin film devices are fabricated on compound semiconductor layers consisting of one or more regions having a uniform composition. Advances in the Molecular Beam Epitaxy (MBE) process have contributed to rapid progress in fabricating such devices. However, the growth and application of thin-films having a graded composition have received little attention. Although device modeling suggests many useful applications for graded composition devices, the difficulty of growing accurately graded structures having predetermined compositional profiles has severely restricted the development of such devices.

Graded structures have been grown using the MBE process by modulating the flux intensity of one of the molecular beams by varying shutter opening or by varying the effusive cell temperature. However, accurate and continuous control with fast response time is difficult. Many of the graded structures grown by the conventional MBE process have discrete compositional steps rather than smoothly varying profiles.

The use of the laser to radiate a single source of $Hg_{0.7}Cd_{0.3}Te$ within a vacuum chamber has also been used to deposit thin films having the same composition as the target (J. T. Cheung, Appl. Phys. Lett 43(3), 255, Aug. 1, 1983). However, a method is needed for growing high quality, epitaxial films of $Hg_{1-x}Cd_xTe$ having smoothly varying compositional gradients of any desired profile.

SUMMARY OF THE INVENTION

It is an object of the invention to provide a method for depositing epitaxial films of ternary compounds which have a predetermined compositional profile.

According to the invention, a substrate suitable for growing an epitaxial layer of a ternary compound is placed in a vacuum chamber such as a vacuum chamber used for molecular beam epitaxial (MBE) growth of thin films. In a preferred embodiment, the substrate is CdTe and the ternary compound is $Hg_{(1-x)}Cd_xTe$. Thermal effusive sources of tellurium and Hg are provided in the chamber, and a constant effusion of Te and Hg is provided during growth of the ternary compound on the substrate.

A target of CdTe is placed in the vacuum chamber and a beam of CdTe is formed by evaporating the target using laser radiation. The laser is modulated to provide a corresponding variation in the intensity of the beam of CdTe. Materials from these three sources deposit on the substrate to form an epitaxial layer of $Hg_{(1-x)}Cd_xTe$ in which the relative amounts of Te and Cd (the compositional profile represented by "x") is determined by the modulation of the laser.

DESCRIPTION OF THE PREFERRED EMBODIMENT

Figure 1:
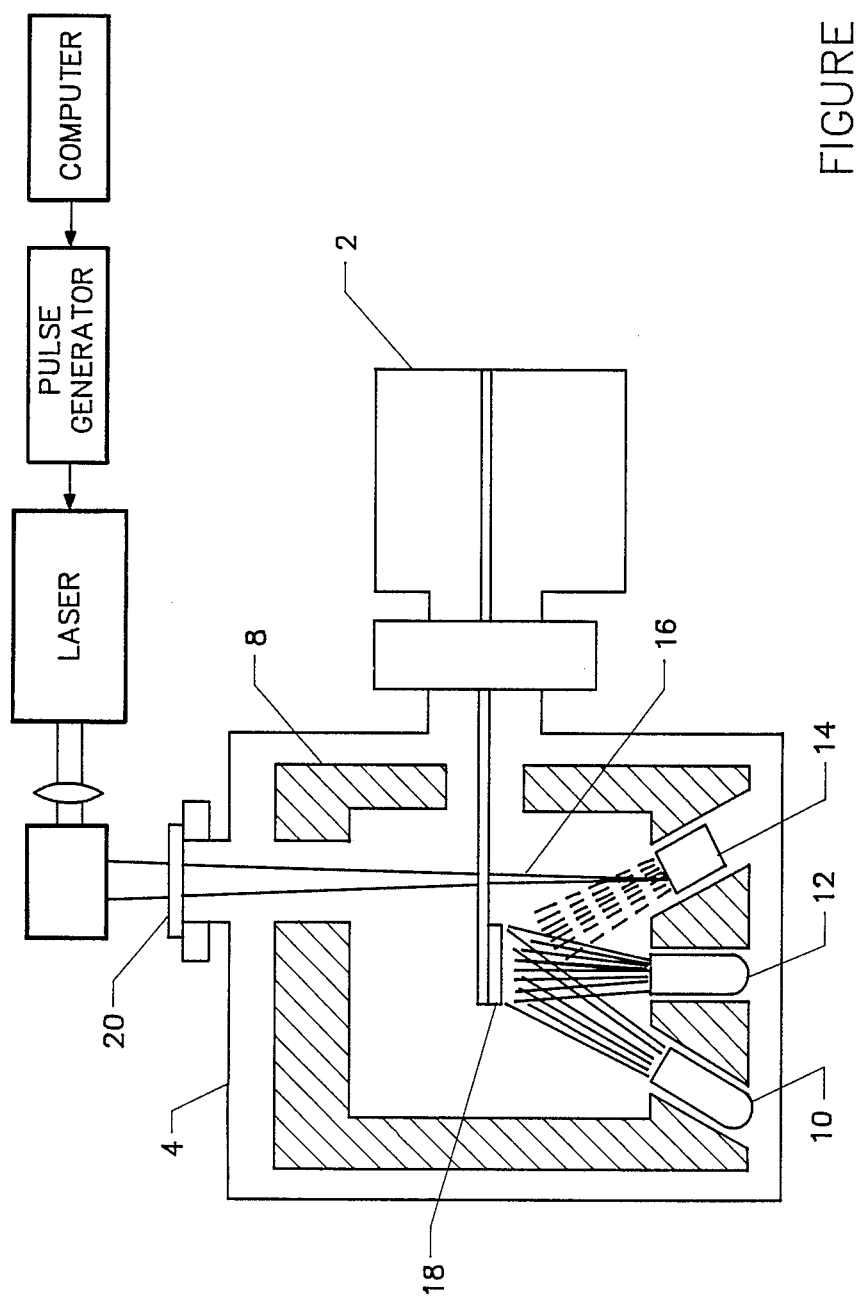
FIG. 1 is a schematic of the Laser Molecular Beam Epitaxy apparatus used to deposit ternary compounds having compositional profiles.

Laser Molecular Beam Epitaxy (MBE) is a variation of conventional MBE made by replacing the Knudsen cells with targets evaporated by pulsed laser radiation. Among its many unique properties, the most appealing one is the fast response time and the ease in modulating the evaporant beam intensity. A simple schematic drawing of the apparatus is shown in FIG. 1. It consists of a preparation chamber 2 and a growth vacuum chamber 4 lined with a liquid nitrogen-cooled shroud 8 for trapping the large Hg throughput. Three sources are used for growing thin films of ternary compounds. In the preferred embodiment using a $Hg_{(1-x)}Cd_xTe$ compound, these sources are CdTe, tellurium, and a high-intensity Hg source. The tellurium and Hg beams are effused from Knudsen cells 10, 12. The CdTe beam is produced by evaporating a polycrystalline CdTe target 14 with radiation 16 from a pulsed laser. A graded HgCdTe film is deposited on a CdTe substrate 18. In growing the graded film, the tellurium and Hg beams are kept constant. Only the CdTe beam is modulated to provide the predetermined compositional gradient of the deposited film.

Nd:YAG lasers have proven acceptable for the laser source because of their ruggedness and long-term stability. The 1.06 um wavelength radiation of these lasers can transmit through UHV view port 20 as shown in FIG. 1. Two types of Nd:YAG laser have been evaluated for evaporating the CdTe target: (1) an acousto-optically Q-switched laser and (2) a Pockel cell Q-switched laser. The acousto-optical Q-switched laser has a repetition rate in the KHz range and an energy content per pulse of about 1 mj with a pulse duration of about 200 ns. The Pockel cell Q-switched laser has a repetition rate that can be varied from 0.5 Hz up to 20 Hz, and it is best operated in the free oscillation mode where energy content per pulse can be as high as 800 mj for a duration of 100 $\mu$s.

Figure 2:
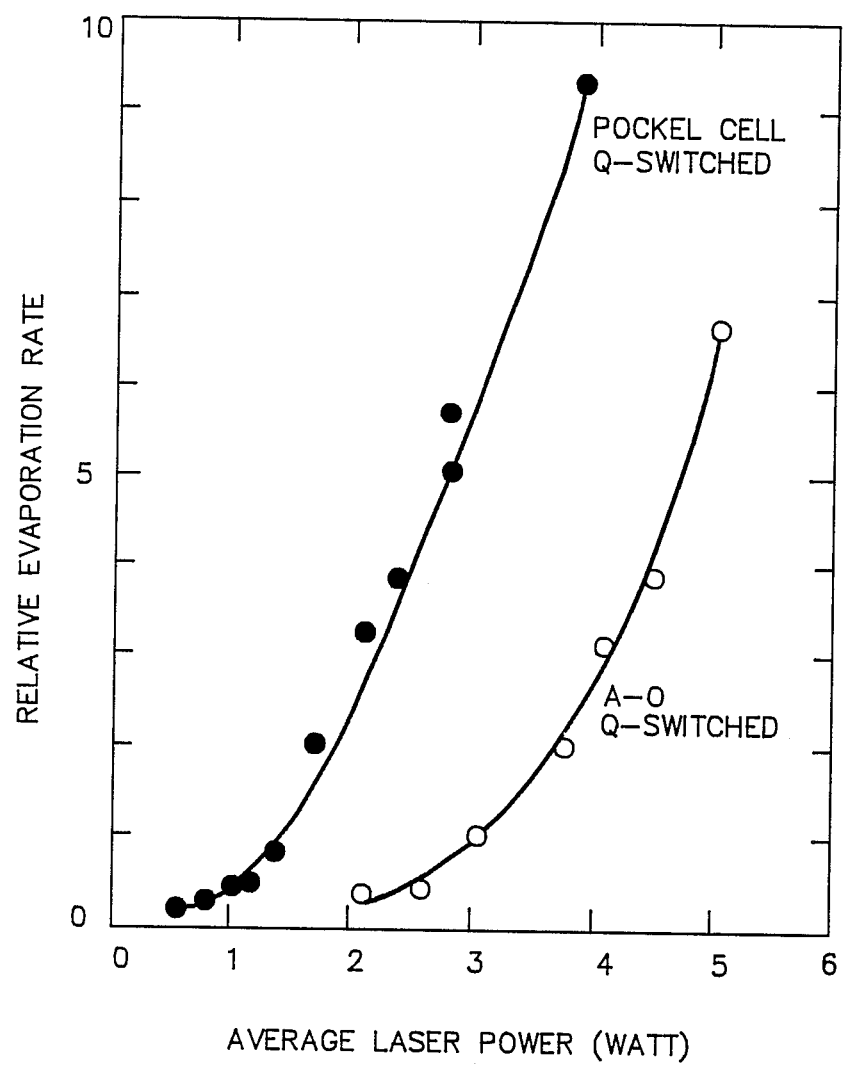
FIG. 2 shows the relative evaporation rate of a CdTe target vs power for two different lasers.

There are three ways to modulate the laser and thereby vary the rate of evaporation of CdTe from the target. The most obvious way is to change the power density of the laser because the peak surface temperature is proportional to the power density times the square root of the pulse duration. Since evaporation rate depends exponentially on the surface temperature, the dependence of evaporation rate on power density is also exponential. This relationship is seen for both lasers shown in FIG. 2. This dependence is sensitive and it is very difficult to achieve precise control. However, it might find use in some situations.

Figure 3:
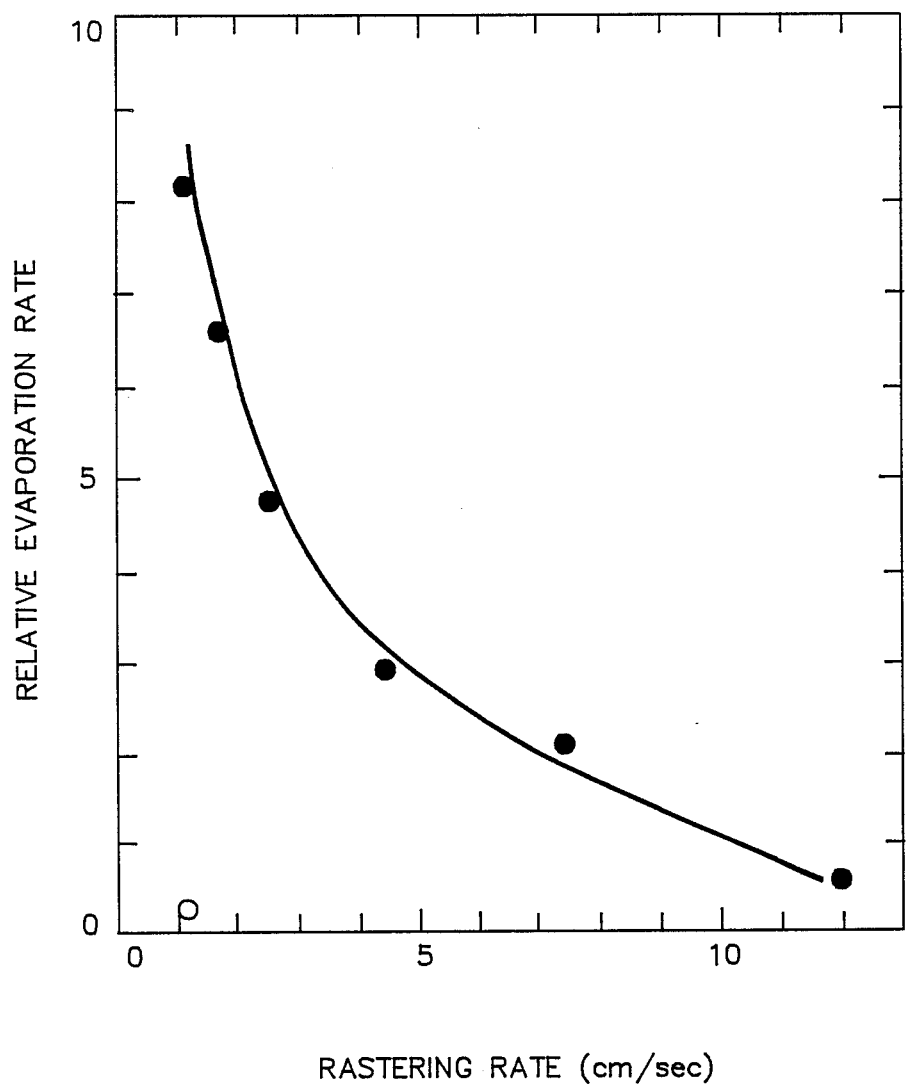
FIG. 3 shows the relative evaporation rate of a CdTe target vs rastering rate for an acousto-optically Q-switched laser.

The second approach is to control the evaporation rate by changing the rastering scan rate of the laser. This approach relies on the heat accumulation due to pulse overlapping. It is only applicable to the acousto-optical Q-switched YAG laser where the duration between consecutive pulses is shorter than the relaxation time of target surface treated by laser irridiation. An example is shown in FIG. 3. The dependence is nonlinear. The evaporation rate decreases slowly as the scanning rate increases. This process is very slow, with response time as long as a few seconds. The degree of overlap between consecutive pulses depend strongly on the surface morphology and is not very reproducible. Therefore, this approach would not be practical for most applications.

Figure 4:
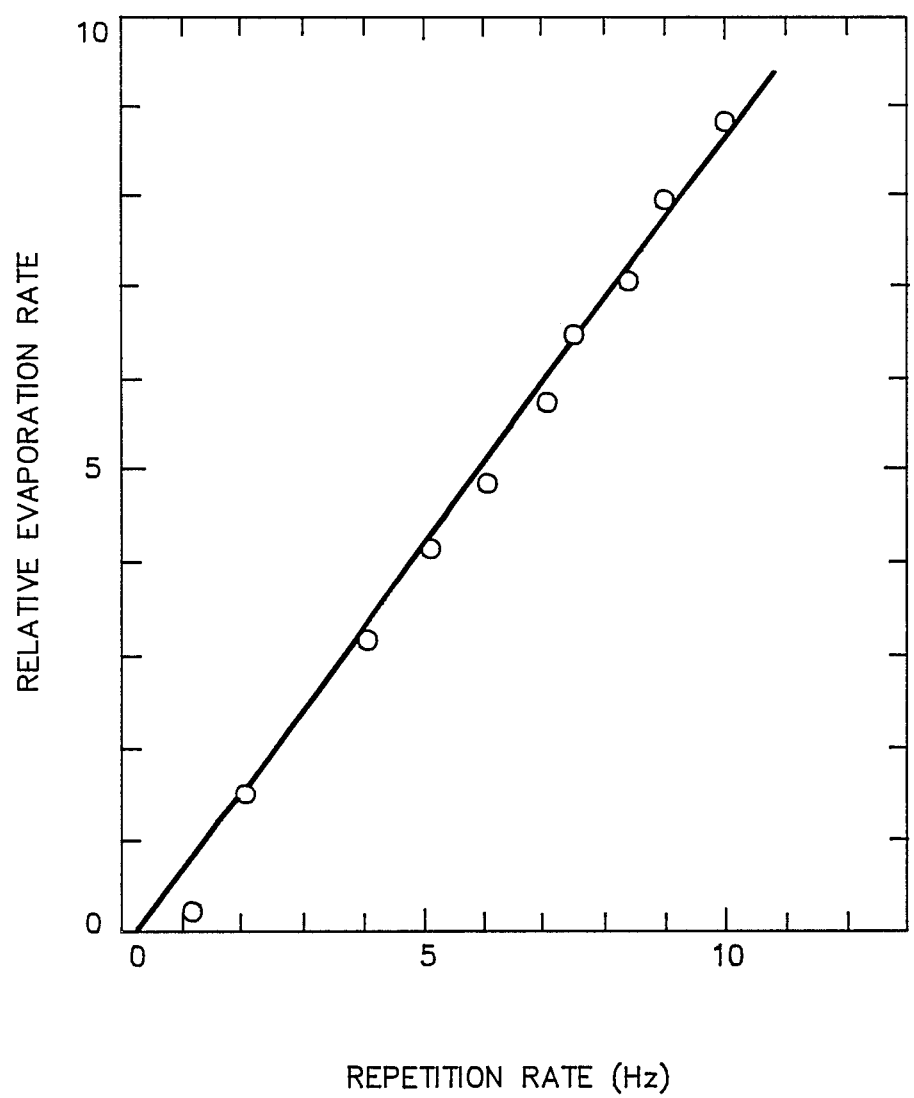
FIG. 4 shows the relative evaporation rate of a CdTe target vs repetition rate for a Pockel cell Q-switched laser.

The third approach is to modulate the CdTe evaporation by changing the laser repetition rate. This approach can be applied by using the Pockel cell Q-switched laser, where the energy content per pulse is constant except for a very slow repetition rate less than 2 Hz, and the duration between consecutive pulses is much longer than the temperature relaxation time of the target heating by laser irridiation. FIG. 4 shows the dependence of evaporation rate on repetition rate for a fixed laser energy. The relationship is linear down to 2 Hz and the evaporation rate is stable over an extended period of time. A random sampling of 20 evaporation rates integrated over a single rastering showed less than 1% deviation. This modulation technique has very fast response so that the total evaporation can be varied within one pulse period. Under typical conditions, each pulse evaporated only enough material to form a fraction of a monolayer surface coverage. Therefore, the composition can be varied from monolayer to monolayer. The composition profile is smooth and the resolution is limited by the interdiffusion, but not by the growth process.

In the following examples $Hg_{(1-x)}Cd_xTe$ layers were grown on a (100) CdTe substrate at a temperature of 180° C. by simultaneously opening the Hg, the tellurium, and the CdTe beams. The Hg beam, which was kept at a constant value, is about three orders of magnitude more intense than the other components in order to prevent thermal decomposition of the as-grown layer. Growth rate is determined by the sum of the intensities of the tellurium and CdTe beams. Accordingly, the growth rates of the ternary compound layers in Examples I to III was higher than for the binary HgTe compound. The composition "x" is determined by the CdTe to tellurium beam intensity ratio. To vary the composition of the layer, the evaporation of CdTe was modulated by changing the repetition rate of a Pockel cell Q-switched laser.

Figure 5:
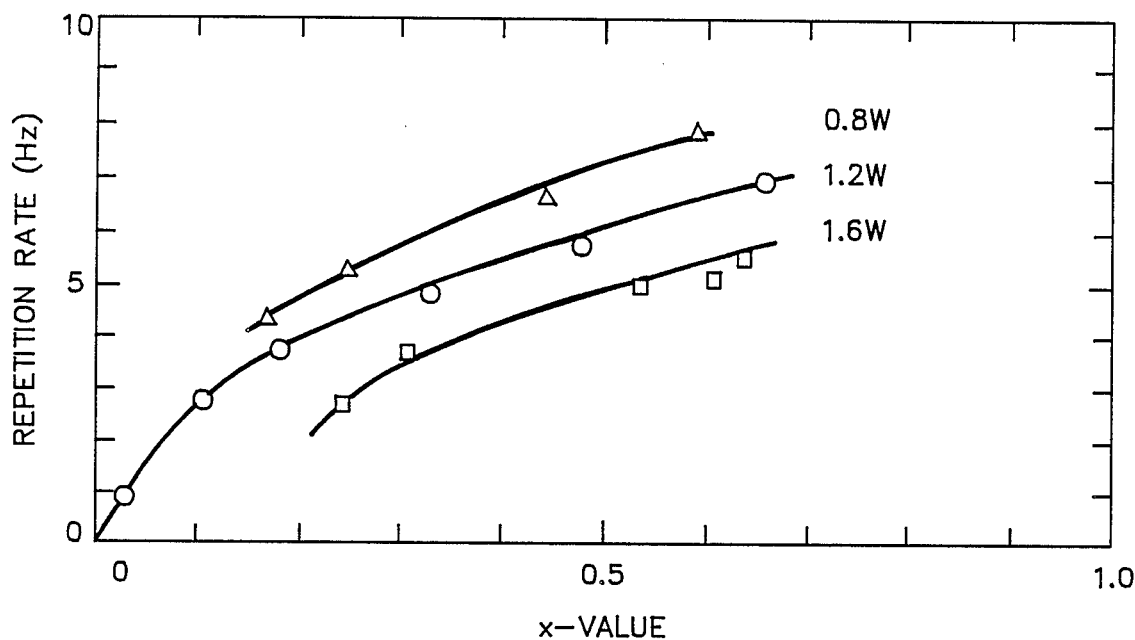
FIG. 5 shows the Cd content (x-value) vs repetition rate at three power output levels of a Pockel cell Q-switched laser.

Absorption of the 1.06 um radiation by the CdTe target cause a rapid rise in its surface temperature and commencement of evaporation. The velocity distributions of the evaporants were measured by time-of-flight analysis and were found to be Maxwell-Boltzman. This suggests that the evaporation process was under equilibrium. The surface temperature of the target was in the range of 1400° C. (for 0.6 W laser power) to 3200° C. (for 4.8 W laser power). FIG. 5 is a calibration curve showing the Cd content obtained (x-value) for a particular repetition rate at three power levels. The smoothness of the calibration curves is indicative of the reproducibility of the process.

In the following examples, an average laser power of 1.2 W at 10 Hz was used:

EXAMPLE I—Manual Control to Obtain a Maximum

Figure 6:
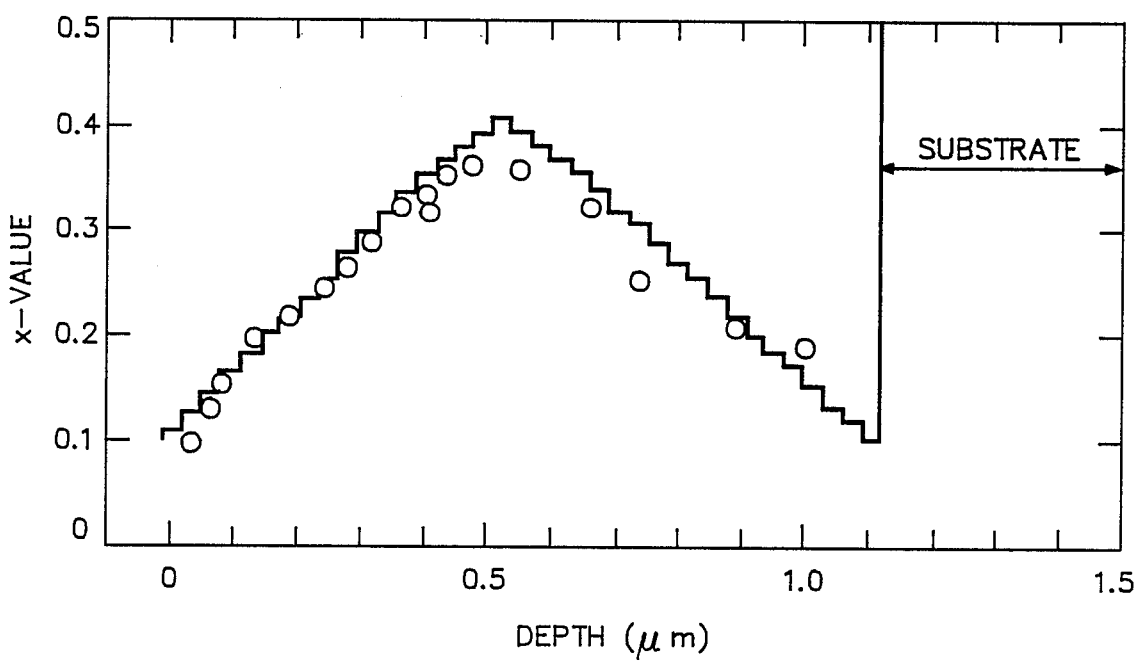
FIGS. 6–7 show the Cd composition profiles of $Hg_{(1-x)}Cd_xTe$ epitaxial layers grown by manual modulation of the laser.

In this example, the laser repetition rate was controlled manually according to the conditions established by the calibration curve of FIG. 5. The variation was made in 50 s intervals corresponding to 200 Angstroms thick discrete layers. The laser repetition rate was controlled to obtain a maximum Cd compositional profile in the center of the layer with symmetrical linear composition gradients on both sides as shown in FIG. 6. Total depth (or thickness) of the layer is about 1.2 $\mu$m.

The composition profile as shown by the circles was obtained by a series of etching in dilute Bromine/HBr solution, followed by measuring the reflectance spectra. The composition "x" was deduced from the position of the $E_1$ transition. The depth resolution is about 350 Angstroms estimated from the absorption coefficient of CdTe in the visible spectral region. This resolution is too large for observing the steps in the profile, but enough to demonstrate the general features. Most importantly, this technique is simple and does not introduce uncertainty often associated with ion sputtering used by either SIMS or Auger electron spectroscopy profiling techniques.

Several precautions were taken to assure accurate depth measurement. First, the etching solution was frequently replenished to assure its strength and to maintain a constant etching rate. Second, the spin etch technique was used to avoid edge effect. Third, the depth value was corrected for the compositional dependence on etching rate. The composition profile in the layer was found to be in good agreement with the intended profile.

EXAMPLE II—Manual Control to Obtain a Minimum

Figure 7:
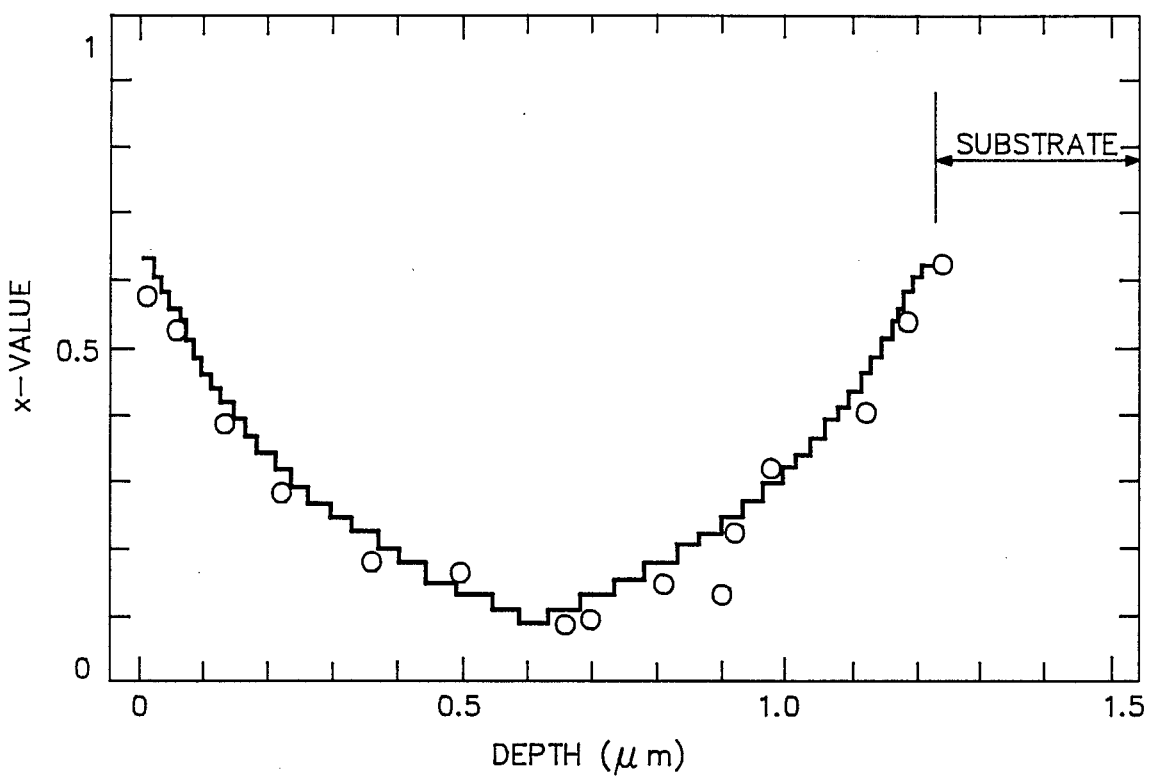

This example was deposited as described for Example I except the laser repetition rate was controlled manually to obtain a minimum Cd composition in the center of the layer as shown in FIG. 7.

EXAMPLE III—Computer Control to Obtain Complex Profile

In order to grow very complex profiles with a smooth gradient, a computer was used to control the process. The laser pulsing circuit was triggered with 100 $\mu$s pulses from a waveform pulse generator which is interfaced with a computer as shown in FIG. 1. Analog output from the computer is used to drive the waveform generator. Through the use of a voltage-to-frequency converter, the input voltage is converted to frequency of the laser pulses. Therefore, a computer-generated voltage sequence can be converted to modulate the laser repetition rate. Since the output voltage sequence is continuous, the change in repetition rate is also continuous. Consequently, the composition profile is smooth.

Figure 8:
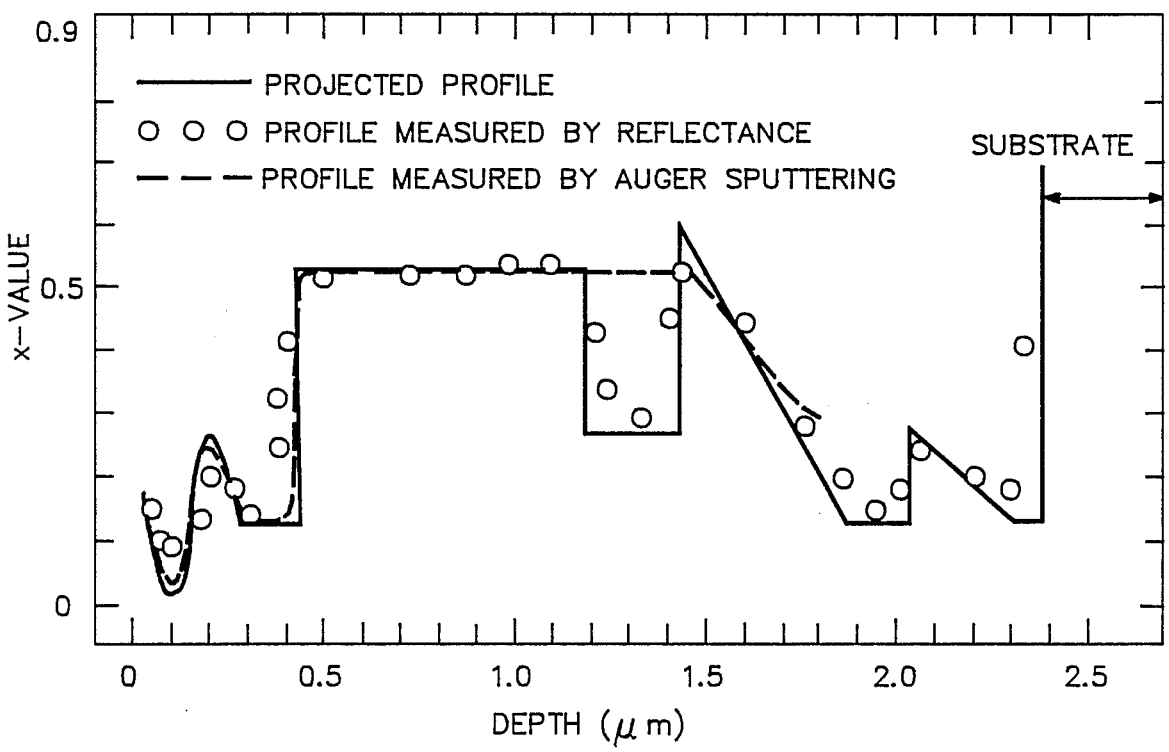
FIG. 8 shows the Cd composition profile of a $Hg_{(1-x)}Cd_xTe$ epitaxial layer grown by computer modulation of the laser.

A complex composition profile was grown by using this scheme. The projected composition profile is a collection of a sinusoidal structure, a rectangular barrier, and two linear ramps with different heights. The entire structure is about 2 μm thick and is shown in FIG. 8. A composition profile was obtained by successive spin etching, followed by reflectance spectra measurements. The results were then corrected for the composition-dependent etch rates. A comparison with the projected composition profile shows good agreement. Some noteworthy features are the shape of the sinusoidal structure and the flat plateau of the rectangular barrier. These are indicative of stability and reproducibility in beam intensity modulation by laser evaporation. This layer was also analyzed by Auger sputtering. Good agreement was found in the near-surface region. Deviation from the etching measurements increase with the depth of the layer, presumably due to undesirable effects associated with sputtering.

The method described in the above examples can be applied to depositing graded layers of other ternary compounds which are similar to the exemplary $Hg_{(1-x)}Cd_xTe$, for example $Hg_{(1-x)}Cd_xSe$, $Ga_{(1-x)}Al_xAs$, and $In_{(1-x)}Ga_xSb$. Detailed procedures to be used with these other compounds can be determined empirically. However, based upon the above examples, the target for laser evaporation should be a binary compound with the larger bandgap in the ternary compound (for example: CdSe, AlAs and GaSb in the above examples). Beams of the remaining elements (Hg and Se, Ga and As, In and $S_b$) should be evaporated with thermal sources.

Numerous variations can be made without departing from the invention. Accordingly, it should be understood that the form of the invention described above is illustrative and is not intended to limit the scope of the invention.

What is claimed is:

1. A method for depositing HgCdTe having a compositional profile, comprising:
   providing a vacuum chamber;
   providing a substrate in the vacuum chamber;
   providing a thermal source of Te in the vacuum chamber;
   providing a thermal source of Hg in the vacuum chamber;
   providing a target of CdTe in the vacuum chamber;
   maintaining constant effusion of the Te and Hg;
   evaporating CdTe from the target using laser radiation to form a beam of CdTe; and
   modulating the laser radiation to vary the beam of CdTe, whereby $Hg_{(1-x)}Cd_xTe$ is deposited on the substrate having a compositional profile in accordance with the modulating of the laser radiation.

2. The method as claimed in claim 1, wherein the substrate comprises a CdTe substrate.

3. The method as claimed in claim 1, wherein the laser is modulated by changing the laser repetition rate.

4. The method as claimed in claim 1, wherein the laser is modulated by changing its power density.

5. The method as claimed in claim 1, wherein the laser comprises a Nd:YAG laser.

6. The method as claimed in claim 1 wherein the laser is modulated using a waveform pulse generator which is driven by a 7. A method for depositing a ternary compound having a compositional profile, comprising:
   providing a vacuum chamber;
   providing a substrate in the vacuum chamber;
   providing a thermal source of a first element of the ternary compound in the vacuum chamber;
   providing a thermal source of a second element of the ternary compound in the vacuum chamber;
   providing a target of a binary compound containing a third element of the ternary compound and an element selected from the group consisting of the first element and the second element;
   maintaining effusion of the one element and of the second element;
   evaporating the compound from the target using laser radiation to form a beam of the compound; and
   modulating the laser radiation to vary the beam of the compound, whereby the composition of the ternary compound is deposited on the substrate in accordance with the modulating of the laser radiation.

8. The method as claimed in claim 7, wherein the target is a binary compound with the larger bandgap in the ternary compound and the first and second elements are one of the elements in the binary compound and the element of the ternary compound that is not in the binary compound.

9. The method as claimed in claim 7, wherein the first element is Te, the second element is Hg, the third element is Cd, and the binary compound is CdTe.

* * * * *

UNITED STATES PATENT AND TRADEMARK OFFICE
CERTIFICATE OF CORRECTION

PATENT NO. : 4,740,386

DATED : April 26, 1988

INVENTOR(S) : Jeffrey T. Cheung

It is certified that error appears in the above-identified patent and that said Letters Patent is hereby corrected as shown below:

Column 1, Lines 7-9, change the sentence under the heading "STATEMENT OF GOVERNMENT INTEREST" to read:

The Government has rights in this invention pursuant to Contract No. N-00014-83-C-0736.

Signed and Sealed this

Eighteenth Day of December, 1990

Attest:

HARRY F. MANBECK, JR.

*Attesting Officer*     *Commissioner of Patents and Trademarks*